United States Patent [19]
Jayaraman et al.

[11] Patent Number: 5,914,976
[45] Date of Patent: *Jun. 22, 1999

[54] VCSEL-BASED MULTI-WAVELENGTH TRANSMITTER AND RECEIVER MODULES FOR SERIAL AND PARALLEL OPTICAL LINKS

[75] Inventors: Vijaysekhar Jayaraman, Goleta; David J. Welch, Santa Maria, both of Calif.

[73] Assignee: W. L. Gore & Associates, Inc., Newark, Del.

[*] Notice: This patent issued on a continued prosecution application filed under 37 CFR 1.53(d), and is subject to the twenty year patent term provisions of 35 U.S.C. 154(a)(2).

[21] Appl. No.: 08/780,767

[22] Filed: Jan. 8, 1997

[51] Int. Cl.$^6$ ............................................. H01S 3/19
[52] U.S. Cl. ........................ 372/50; 372/96; 359/152
[58] Field of Search .................... 372/50, 96; 385/93; 359/152

[56] References Cited

U.S. PATENT DOCUMENTS

| | | | |
|---|---|---|---|
| 5,027,434 | 6/1991 | Brahms et al. | 359/152 |
| 5,093,879 | 3/1992 | Bregman et al. | 385/93 |
| 5,136,603 | 8/1992 | Hasnain et al. | 372/50 |
| 5,140,152 | 8/1992 | Van Zeghbroeck | 250/214 |
| 5,408,105 | 4/1995 | Adachi et al. | 372/50 |
| 5,513,204 | 4/1996 | Jayaraman | 372/96 |
| 5,533,041 | 7/1996 | Matsuda et al. | 372/50 |
| 5,577,064 | 11/1996 | Swirhun et al. | 372/50 |

FOREIGN PATENT DOCUMENTS

| | | |
|---|---|---|
| 44 44 470 | 5/1996 | Germany . |
| 06037299 | 2/1994 | Japan . |

OTHER PUBLICATIONS

Translation of Grote's "Transceiver Device for an Optical Duplex System" DE 44 44 470 A1, May 30, 1996.

Jain et al. "P–38: Monolithic Integration of Red, Blue, and Green Lasers for Smart Projection Displays" 1995 SID International Symposium Digest of Technical Papers, Orlando, May 23–25, 1995, May 23, 1995, Society for Information Display, pp. 516–519.

Bouley, J.C., "InP–based Photoic Integrated Circuits for Future Optical Access Network", LEOS Conference, Boston, MA, Nov. 18–21, 1996, pp. 286–287.

Okano, H. et al., "Passive Aligned Hybrid Integrated Optical Module Using Planar Lightwave Circuit Platform", LEOS Conference, Boston, MA, Nov. 18–21, 1996, pp. 73–74.

*Primary Examiner*—Rodney Bovernick
*Assistant Examiner*—Yisun Song
*Attorney, Agent, or Firm*—Victor M. Genco, Jr.

[57] ABSTRACT

An optoelectronic module includes one or more VCSEL transmitters and/or photodetectors coincidentally aligned along a common central longitudinal axis. Differing wavelengths of light can be received and transmitted by the optoelectronic module optically coupled to a single optical fiber or in a free-space link. The optoelectronic module is able to receive two wavelengths and transmit one wavelength, or can transmit two wavelengths in the optical link. The VCSEL transmitter can be optically pumped by a vertically integrated pump VCSEL. A parallel optical link supports transmission and reception for each duplex channel on a single optical fiber. The parallel optical link includes an array of optical fibers, a first array of optoelectronic modules optically coupled to the array of optical fibers to transmit a laser signal having a first wavelength and receive a laser signal having a second wavelength, and a second array of optoelectronic modules optically coupled to the array of optical fibers to transmit the laser signal having the second wavelength and receive the laser signal having the first wavelength. A multi-channel data distribution system enables bidirectional distribution of data between a central distribution point and a number of nodes optically linked to the central distribution point.

53 Claims, 11 Drawing Sheets

5,914,976

VCSEL-BASED MULTI-WAVELENGTH TRANSMITTER AND RECEIVER MODULES FOR SERIAL AND PARALLEL OPTICAL LINKS

FIELD OF THE INVENTION

This invention relates generally to duplex transmission, and more particularly to vertical cavity surface emitting laser (VCSEL)-based multi-wavelength transmitter and receiver modules for serial and parallel optical links.

BACKGROUND OF THE INVENTION

The traditional solution to the problem of allowing both transmit and receive signals over a single optical fiber requires spatial separation of transmit and receive laser beams outside the optical fiber. This spatial separation is conventionally accomplished using a planar lightwave circuit and edge-emitting lasers and waveguide detectors.

An example of the planar lightwave circuit approach is described in an article by H. Okano et al. entitled "Passive Aligned Hybrid Integrated Optical Module Using Planar Lightwave Circuit Platform" from the LEOS Conference, Boston, Mass., Nov. 18–21, 1996, pp. 73–74. Such planar lightwave circuit approach would be simplified if the transmit and receive laser beams could remain collinear. For such an approach to be feasible, the transmit and receive signals must be at different wavelengths.

As an example of the collinear approach, in an article by J. C. Bouley entitled "InP-based Photonic Integrated Circuits for future Optical Access Networks" from the LEOS Conference, Boston, Mass., Nov. 18–21, 1996, pp. 286–287, an edge-emitting laser transmits at a wavelength of 1.3 microns and a waveguide photodetector receives at a wavelength of 1.55 microns. The small tolerance for aligning an edge-emitter to fiber makes it difficult to couple single-mode fiber to edge-emitting lasers. The edge-emitting laser is an expensive distributed feedback laser or an etched facet laser because the waveguide photodetector behind the laser prevents the laser from being configured with a simple cleaved facet. It is difficult to control the amount of leakage from the back of the 1.3 micron edge-emitter laser into the 1.55 micron photodetector. This introduces optical crosstalk. The edge-illumination geometry requires compositional variations in the lateral direction (in the plane of the wafer), which leads to difficult growth and processing. A package using edge-emitting laser technology can be bulky and expensive.

SUMMARY OF THE INVENTION

The invention provides a vertical cavity surface emitting laser (VCSEL)-based optoelectronic module which supports multi-wavelength transmission over a single optical fiber or a free-space optical link. In an illustrative embodiment, the optoelectronic module includes a VCSEL transmitter and a photodetector. The incoming received light and transmitted light are at different wavelengths and are coupled out of and into the same optical fiber or free-space optical link. In a first arrangement, the received light passes through the VCSEL before hitting the photodetector. The received wavelength is in a range from 1450–1650 nm, for example, 1550 nm, and the transmitted wavelength is in a range from 1250–1350 nm, for example 1300 nm. The VCSEL transmitter includes a pair of mirror stacks and an active region interposed between the pair of mirror stacks. The mirror stacks are each a system of alternating layers of GaAs and AlGaAs ("a GaAs/AlGaAs system") which forms a distributed Bragg reflector. At least one of the mirror stacks is wafer fused to the active region. One of the mirror stacks is below 0.0001 percent transmissive to the transmitted light. The VCSEL transmitter can be optically pumped by a pump VCSEL, wherein the pump laser radiation is in a range from 700–1050 nm, for example an 850 nm pump VCSEL.

In a second arrangement, the received incoming light is at a shorter wavelength than the transmitted light and the transmitted light from the VCSEL transmitter passes through the photodetector prior to entering the fiber or freespace optical link. The received wavelength is nominally in a range from 700–870 nm, and the transmitted wavelength is in a range from 870–1050 nm. The two wavelengths are coupled out of and into the same optical fiber or free-space channel.

In a specific embodiment of the invention, a multi-channel VCSEL-based parallel optical link for one or more channels supports transmission and reception for each channel on a single optical fiber. Such parallel optical link includes an array of optical fibers, a first array of optoelectronic transceiver modules optically coupled to the array of optical fibers in order to transmit a laser signal having a first wavelength and receive a laser signal having a second wavelength, and a second array of optoelectronic transceiver modules optically coupled to the array of optical fibers to transmit the laser signal having the second wavelength and receive the laser signal having the first wavelength.

In another embodiment of the invention, an optoelectronic module includes a vertical cavity surface emitting laser (VCSEL) transmitter, a front photodetector, and a back photodetector. The VCSEL transmitter is operative to transmit a first laser signal having a first wavelength into an optical fiber or free-space link. The front photodetector is operative to receive a second laser signal having a second wavelength from the optical fiber or free-space link. The back photodetector is operative to receive a third laser signal having a third wavelength from the optical fiber or free-space link. The VCSEL transmitter, the front photodetector, and the back photodetector have optical axes which are substantially collinear.

In yet another embodiment of the invention, an optoelectronic module for use in an optical link includes a front VCSEL transmitter. The front VCSEL transmitter is operative to transmit a first laser signal having a first wavelength into the optical link, and is adapted so that a second laser signal having a second wavelength can pass therethrough.

The principles of the invention can be practiced in a multi-channel data distribution system.

Other features and advantages of the invention will become apparent from the following detailed description, taken in conjunction with the accompanying drawings, which illustrate, by way of example, the features of the invention.

DETAILED DESCRIPTION

Figure 1:
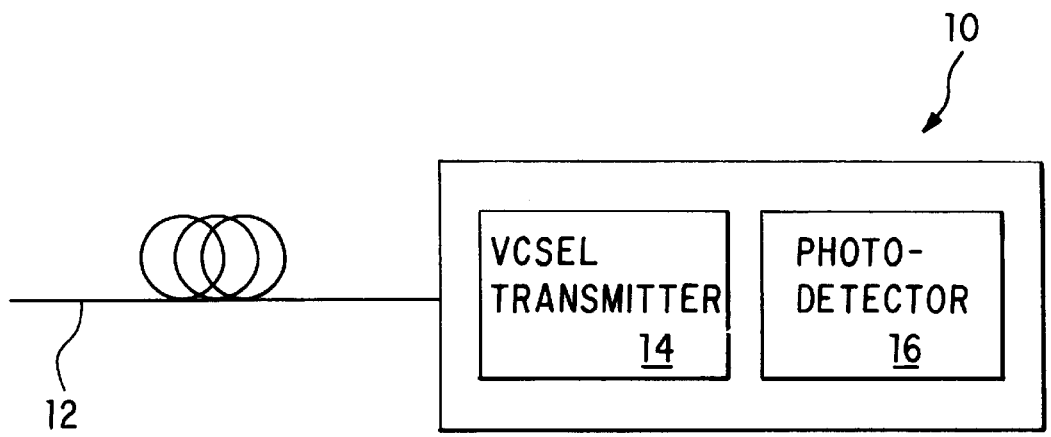
FIG. 1 is a schematic view of an optoelectronic module coupled to an optical fiber according to the principles of the invention.

A VCSEL-based optoelectronic module according to the principles of the invention provides for transmitting and receiving optical laser signals having differing wavelengths over a single optical fiber or in a free-space optical link. Referring to FIG. 1, an optoelectronic module 10 according to the principles of the invention is optically coupled to an optical fiber 12 or can be used in a free-space link. The optoelectronic module 10 includes a VCSEL transmitter 14 and a p-i-n photodetector 16 monolithically integrated with the VCSEL transmitter 14. The incoming received optical signals from the optical fiber 12 pass through the VCSEL transmitter 14 before being received by the p-i-n photodetector 16 of the optoelectronic module 10.

Figure 2:
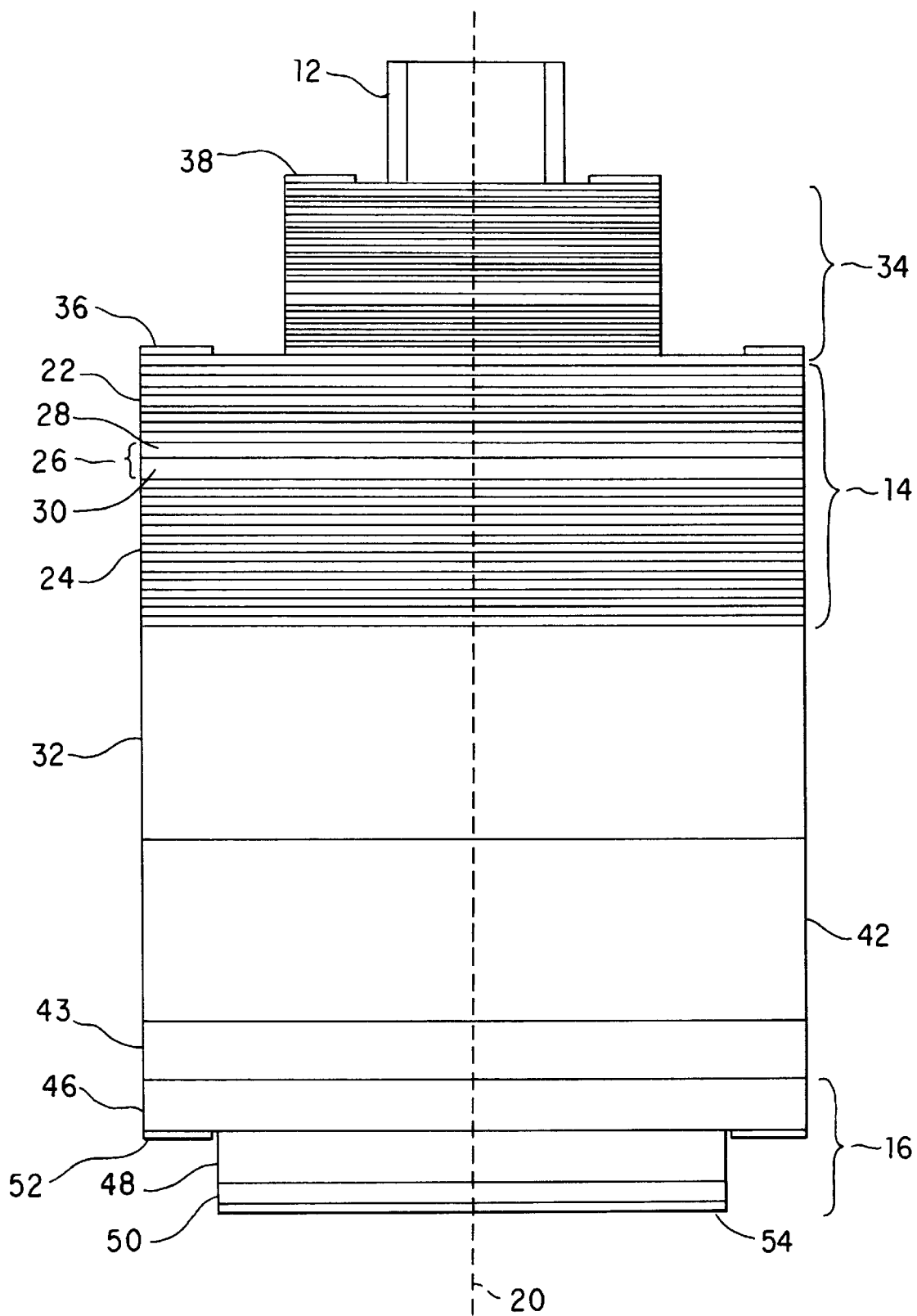
FIG. 2 is a side elevational view of the optoelectronic module depicted in FIG. 1.

Referring to FIG. 2, the VCSEL-based optoelectronic module includes VCSEL transmitter 14, which has an optical axis coincident with a central longitudinal axis 20. The optical axis is the path of light propagation in the VCSEL transmitter 14. The VCSEL transmitter 14 includes a plurality of layers of semiconductor, which includes a top mirror stack 22, a bottom mirror stack 24 and an active region 26 interposed between the top and bottom mirror stacks. Each of the top and bottom mirror stacks 22, 24 is made from the "GaAs/AlGaAs system". The "GaAs/AlGaAs system" is a group of materials which includes gallium arsenide (GaAs), aluminum arsenide (AlAs), and aluminum gallium arsenide (AlGaAs). The bottom mirror stack 24 includes approximately fifty (50) pairs of alternating layers of GaAs and AlGaAs, and the top mirror stack includes a lesser number of pairs of alternating layers of GaAs and AlGaAs than the bottom mirror stack. Laser radiation is emitted from VCSEL transmitter 14 through the top mirror stack 22 from the top surface of the VCSEL.

The active region 26 includes quantum wells, barrier material separating the quantum wells, and a pair of cladding layers 28, 30. The quantum wells are sandwiched between the pair of cladding layers 28, 30.

The bottom mirror stack 24 is disposed above a compound semiconductor substrate 32, which is preferably a GaAs substrate. The top mirror stack 22 and the bottom mirror stack 24 are each wafer-fused to the active region 26 therebetween. Wafer fusion is a process by which materials of different lattice constant are atomically joined by applying pressure and heat to create a real physical bond. Wafer fusion of the mirror stacks to the active region is used to increase the reflectivity provided by the mirror stacks so that the lasing threshold can be reached and maintained. This creates a wafer-fused interface between the top mirror stack 22 and the active region 26 and a wafer-fused interface between the bottom mirror stack 24 and the active region 26.

The long-wavelength VCSEL transmitter 14 is optically pumped by a short-wavelength pump VCSEL 34 which is integral with the VCSEL transmitter 14. The VCSEL transmitter 14 emits coherent electromagnetic radiation having a wavelength in a range from 1250 to 1350 nm, for example 1.3 μm.

The short-wavelength pump VCSEL 34 includes a plurality of layers of semiconductor and is disposed about the emitting surface of the top mirror stack 22 centered about the central longitudinal axis 20. The pump VCSEL 34 is electrically powered using two metallized contacts. A first metallized contact 36 for pumping the short-wavelength pump VCSEL 34 is connected to the bottom mirror stack of pump VCSEL 34. The first metallized contact 36 has an annular shape and is centered about the central longitudinal axis 20. The annular metallized contact 36 circumscribes the short-wavelength pump VCSEL 34 disposed on the top mirror stack 22 of the VCSEL transmitter 14. A second metallized contact 38 for electrically pumping the short-wavelength pump VCSEL 34 is disposed above the pump VCSEL 34. The second metallized contact 38 is centered about the central longitudinal axis 20. The pump VCSEL 34 is electrically pumped to emit a pumping laser beam having a wavelength in a range from 700 nm to 1050 nm, such as, for example, 850 nm into VCSEL transmitter 14 to pump such long-wavelength VCSEL transmitter. The pump VCSEL 34 is nearly one hundred percent transmissive to electromagnetic radiation having a wavelength in a range from 1250 nm to 1350 nm and to electromagnetic radiation having a wavelength in a range from 1450 nm to 1650 nm. Therefore, incoming received optical signals for the photodetector can pass through the pump VCSEL 34 unimpeded and outgoing transmitted optical signals from the VCSEL transmitter 14 can pass through the pump VCSEL unimpeded. A long wavelength, vertical cavity surface emitting laser with a vertically integrated optical pump and a process for making it are described in detail in U.S Pat. No. 5,513,204 entitled "LONG WAVELENGTH, VERTICAL CAVITY SURFACE EMITTING LASER WITH VERTICALLY INTEGRATED OPTICAL PUMP" issued Apr. 30, 1996 to Vijaysekhar Jayaraman, which is incorporated by reference as if fully set forth herein.

An indium phosphide (InP) substrate 42 is disposed beneath and integral with the GaAs substrate 32. An optional absorber layer 43 can be disposed beneath the InP substrate 42. The absorber layer 43 will absorb back-leaking light from the VCSEL transmitter, but not the received light. The purpose of the absorber layer 43 is to absorb light from the backside of the VCSEL transmitter, and prevent it from reaching the photodetector beneath the VCSEL transmitter, which is intended only to detect light received from the optical fiber at the receive wavelength. Structural implementation of the optional absorber layer 43 works best when the receive wavelength is longer than the transmit wavelength. If the transmit wavelength is 1.3 microns and the receive wavelength is 1.55 microns, then the preferred absorber layer composition would be indium gallium arsenide phosphide (InGaAsP) with a bandgap wavelength of 1.4 microns.

An indium gallium arsenide (InGaAs) p-i-n photodetector 16 is disposed beneath the absorber layer 43. The InGaAs p-i-n photodetector 16 is centered about the central longitudinal axis 20. The InGaAs p-i-n photodetector 16 is on the side of the InP substrate 42 opposite the side adjacent the GaAs substrate 32. The InGaAs p-i-n photodetector includes a layer 46 of n-doped InP disposed beneath the InP substrate 42, a layer 48 of undoped InGaAs disposed beneath the layer 46 of n-doped InP, and a layer 50 of p-doped InGaAs disposed beneath the layer 48 of undoped InGaAs. The layer 48 of undoped InGaAs and the layer 50 of p-doped InGaAs together present a mesa structure formed on the layer 46 of n-doped InP. The lateral linear dimension of the mesa structure as measured transverse to the central longitudinal axis 20 is approximately 100 $\mu$m.

The InGaAs p-i-n photodetector 16 is electrically powered using two metallized contacts. A first metallized n-type contact 52 for the p-i-n photodetector is applied to the layer 46 of n-doped InP. The first metallized ntype contact 52 has an annular shape and is centered about the central longitudinal axis 20. The first metallized n-type contact 52 circumscribes the mesa structure formed by the layer 48 of undoped InGaAs and the layer 50 of p-doped InGaAs together disposed on the layer of n-doped InP. A second metallized p-type contact 54 is disposed beneath the layer 50 of p-doped InGaAs. The InGaAs p-i-n photodetector 16 is electrically powered during operation to receive optical laser signals having a wavelength in a range from 1450 to 1650 nm, for example 1.55 $\mu$m.

The optoelectronic module shown in FIG. 2 can be used in a free-space optical link, or an optical fiber can be optically coupled to the optoelectronic module. The optical fiber includes a core and a cladding layer surrounding the core. The optical fiber can be a single-mode optical fiber. The optical fiber 12 is coupled to the top of the short-wavelength pump VCSEL 34. The VCSEL-based optoelectronic module can receive 1.55 $\mu$m optical signals from, and can transmit 1.3 $\mu$m optical signals into, the optical fiber 12 or free-space link. The optical fiber 12 is coupled to the pump VCSEL 34 of the optoelectronic module with an alignment tolerance of approximately 5 $\mu$m, and is angled to minimize feedback.

Figure 3:
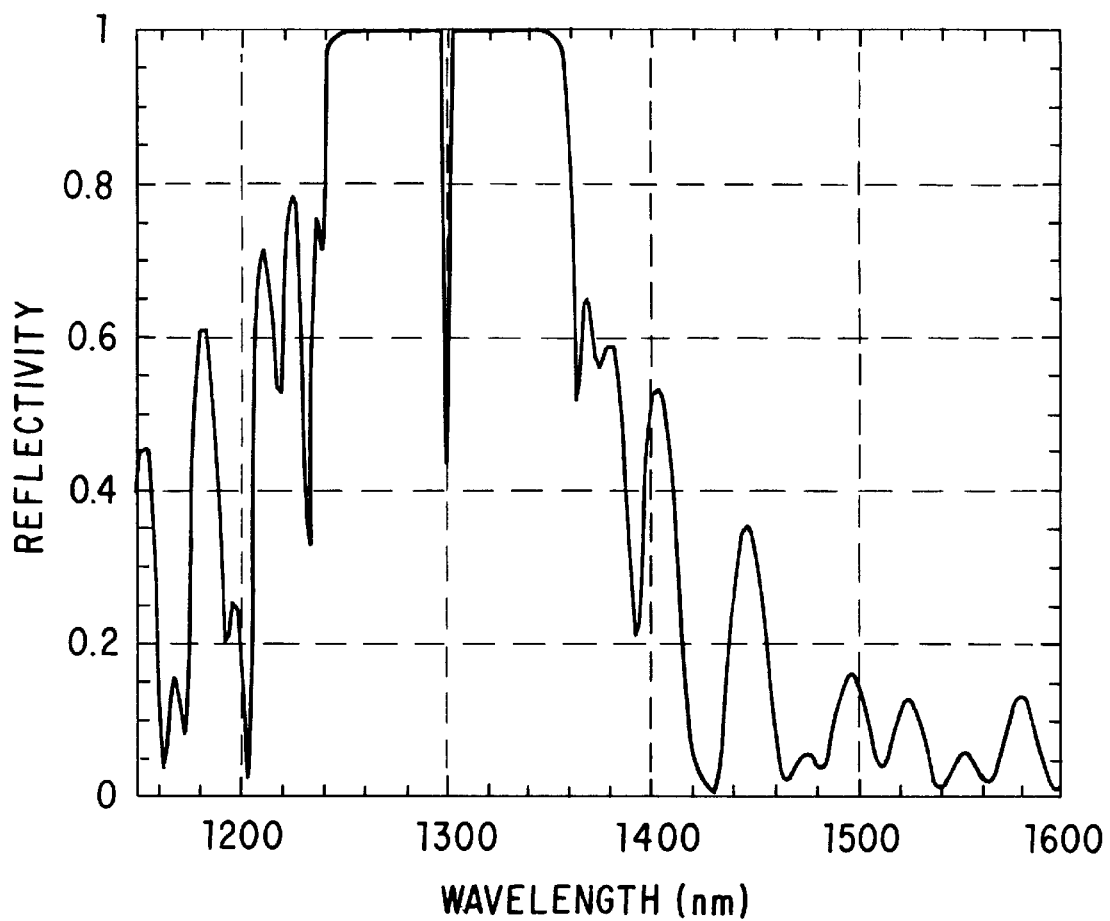
FIG. 3 is a graph showing the reflection spectrum of the VCSEL transmitter in the optoelectronic module depicted in FIG. 2.

The invention allows both transmitting and receiving optical signals over a single optical fiber or in a free-space link. The traditional approach to solving this problem uses edge-emitting lasers and waveguide photodetectors. In a VCSEL-based optoelectronic module according to the first embodiment of the invention, the received signal passes through the VCSEL transmitter to transversely illuminate the photodetector behind the VCSEL transmitter to accomplish photodetection. This approach works whenever the transmitted and received optical signals are separated in wavelength by more than approximately half the bandwidth of the distributed Bragg reflector (DBR) mirrors in the VCSEL transmitter. For the common wavelength pair of 1.3/1.55 $\mu$m, for the transmitted and received optical signals respectively, for VCSEL transmitters using wafer-fused DBR mirrors which are made from the GaAS/AlGaAs system, this condition is easily satisfied. This condition is also satisfied for the wavelength pairs of 780/980 nm and 850/980 nm, for the transmitted and received optical signals respectively. FIG. 3 presents a graph showing a typical reflection spectrum of the 1.3 $\mu$m VCSEL transmitter. The graph illustrates the low reflection of laser radiation at 1.55 $\mu$m by the 1.3 $\mu$m VCSEL transmitter. Also, there will be no absorption of the 1.55 $\mu$m laser radiation in the 1.3 $\mu$m VCSEL transmitter. If the incoming received optical signal is 1.55 $\mu$m and the transmitted optical signal is 1.3 $\mu$m, the DBR mirrors of the 1.3 $\mu$m VCSEL transmitter will reflect less than 20% of the 1.55 $\mu$m laser radiation. As a result, the photodetector will see more than 80% of the incoming 1.55 $\mu$m laser radiation.

If the transmission and reception wavelengths are reversed so that a 1.3 $\mu$m optical signal is received while a 1.55 $\mu$m optical signal is transmitted, then again less than 20% of the received light is lost by reflection. In addition, the 1.55 $\mu$m VCSEL transmitter will absorb some of the incoming 1.3 $\mu$m received optical signal. By designing the active region of the 1.55 $\mu$m VCSEL transmitter such that the absorption occurs only in the quantum wells of the active region of the 1.55 $\mu$m laser, and not in the barrier material, cladding layers, or mirror stacks, the total amount of absorption can be kept to less than 10% The net result is that more than 70% of the incoming 1.3 $\mu$m optical signal is seen by the photodetector. By proper system design, the absorption of the 1.3 $\mu$m optical signal by the 1.55 $\mu$m VCSEL transmitter will not adversely affect bit-error-rate.

Referring to FIG. 2, the number of periods (i.e., pairs of alternating layers) in the bottom mirror stack 24 of the VCSEL transmitter 14 is increased until the backside transmitter light hitting the photodetector 16 is less than the anticipated minimum received light coming in from the optical fiber 12 or free-space link. The bottom mirror stack transmitivity to laser radiation at 1.3 $\mu$m is designed to be less than 0.0001 percent.

Figure 4:
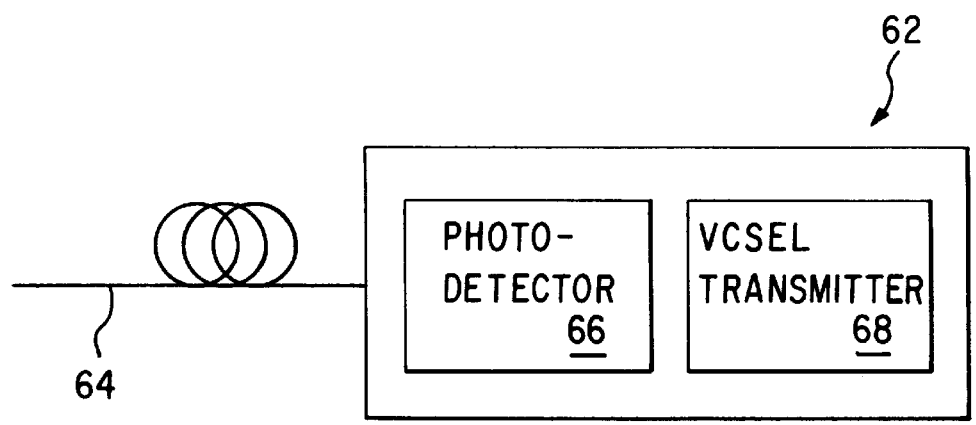
FIG. 4 is a schematic view of an optoelectronic module coupled to an optical fiber according to the principles of the invention.

The photodetector can be disposed in front of the VCSEL transmitter, such that the transmitted light from the VCSEL transmitter passes through the photodetector prior to entering the optical fiber or free-space link. In such arrangement the transmitted optical signal wavelength is longer than the received optical signal wavelength. Referring to FIG. 4, an optoelectronic module 62 according to a second embodiment of the invention is optically coupled to an optical fiber 64 or can be used in a free-space link. The optoelectronic module 62 includes a p-i-n photodetector 66 and a VCSEL transmitter 68 monolithically integrated with the p-i-n photodetector 66. The outgoing transmitted optical signals from the VCSEL transmitter 68 pass through the p-i-n photodetector 66 before entering the optical fiber 64.

Vertical cavity surface emitting lasers (VCSELs) are a breakthrough for parallel optical communications because they can be fabricated on a wafer scale into one and two-dimensional arrays. Recent advances have yielded low-power devices with operating efficiencies comparable to in-plane edge-emitting lasers. It is now possible to produce massively parallel two-dimensional emitter arrays using VCSELs that have acceptable heat generation.

Figure 5:
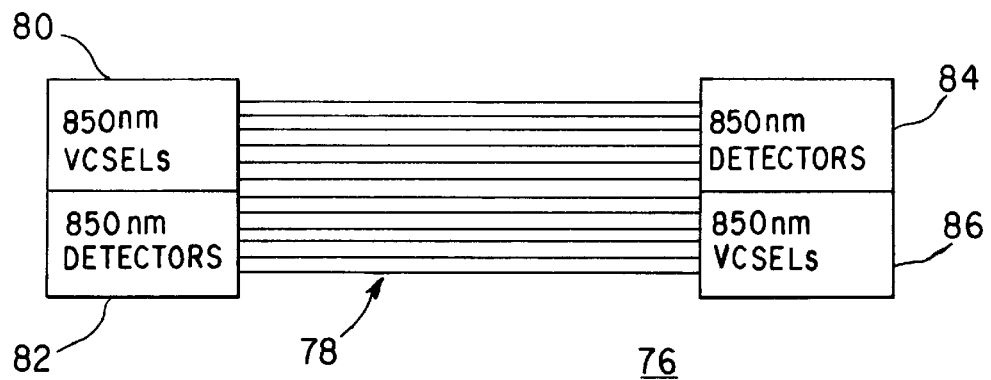
FIG. 5 is a schematic view of a conventional multi-channel parallel optical link.

Referring to FIG. 5, a conventional six-channel parallel optical link 76 is illustrated. The conventional six-channel parallel optical link requires twelve optical fibers 78 (i.e., six pairs of fibers) to allow transmitting and receiving on separate optical fibers. Twelve optical fibers for six channels in such conventional arrangement uses spatial separation of transmitted and received optical signals, which is expensive. In the conventional parallel optical link 76, an array of VCSEL transmitters and an array of photodetectors are coupled to a twelve-wide linear array of multi-mode optical fibers at each end of the parallel optical link. The array of VCSEL transmitters and the array of photodetectors are spaced laterally with respect to the longitudinal direction of travel of the laser radiation between the two ends of the parallel optical link 76. In the typical arrangement, a first array of VCSELs 80 which can emit laser radiation at 850 nm is laterally spaced from a first array of photodetectors 82 to detect laser radiation at 850 nm at the first end of the optical link. At the second end of the optical link 76, a second array of photodetectors 84 capable of receiving 850 nm laser radiation from the first array of 850 nm VCSELs 80 is laterally spaced from a second array of 850 nm VCSELs 86 for transmitting 850 nm laser radiation to the first array of 850 nm photodetectors 82.

Half of the array of optical fibers present in the conventional arrangement shown in FIG. 5 are eliminated by the VCSEL-based multi-channel parallel optical link according to the invention, which enables transmit and receive for each channel on the same optical fiber using different wavelengths for the transmitted and received optical signals. A collinear geometry is used in which at least one of the two wavelengths transmitted and received in the parallel optical link according to the principles of the invention passes through a VCSEL transmitter or a photodetector designed for the other wavelength. According to the invention, duplex transmission of transmitted and received optical signals over each optical fiber uses wavelength separation of the transmit and receive optical signals, rather than spatial separation as in conventional practice. A preferred pair of wavelengths is 980 nm/780 nm, but 980 nm/850 nm will also work, as well as other wavelength combinations.

Figure 6:
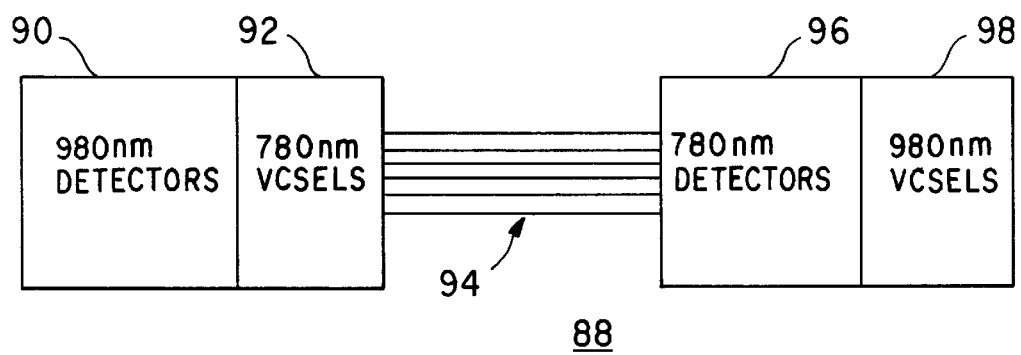
FIG. 6 is a schematic view of a multi-channel parallel optical link according to the principles of the invention.

Referring to FIG. 6, a duplex parallel optical link 88 according to a specific embodiment of the invention includes a first end linked to a second end. Laser radiation travels between the first end and the second end in a longitudinal direction of travel. At the first end, a first array of 980 nm photodetectors 90 and a first array of 780 nm VCSELs 92 are monolithically integrated and substantially collinear. That is, the first array of photodetectors and the first array of VCSELs are spaced longitudinally with respect to the longitudinal direction of travel of laser radiation between the first and second ends of the duplex optical link so that the optical axis of each of the first array of VCSEL transmitters and the optical axis of one of the first array of photodetectors associated therewith are aligned coincidentally along a common central longitudinal axis.

The first array of 780 nm VCSELs 92 transmits laser radiation into a six-wide array of optical fibers 94 in the longitudinal direction of travel. The first array of 980 nm photodetectors 90 receives laser radiation from the array of optical fibers 94 after passing through the first array of 780 nm VCSELs 92.

At the second end, a second array of 780 nm photodetectors 96 and a second array of 980 nm VCSELs 98 are substantially collinear so that the optical axis of each of the second array of photodetectors 96 is coincidentally aligned along a common central longitudinal axis with the optical axis of one of the second array of VCSEL transmitters 98. The second array of 780 nm photodetectors 96 receives laser radiation traveling in the longitudinal direction of travel from the array of optical fibers 94. The second array of 980 nm VCSELs 98 transmits laser radiation through the second array of 780 nm photodetectors 96 into the array of optical fibers 94 in the longitudinal direction of travel.

Figure 7:
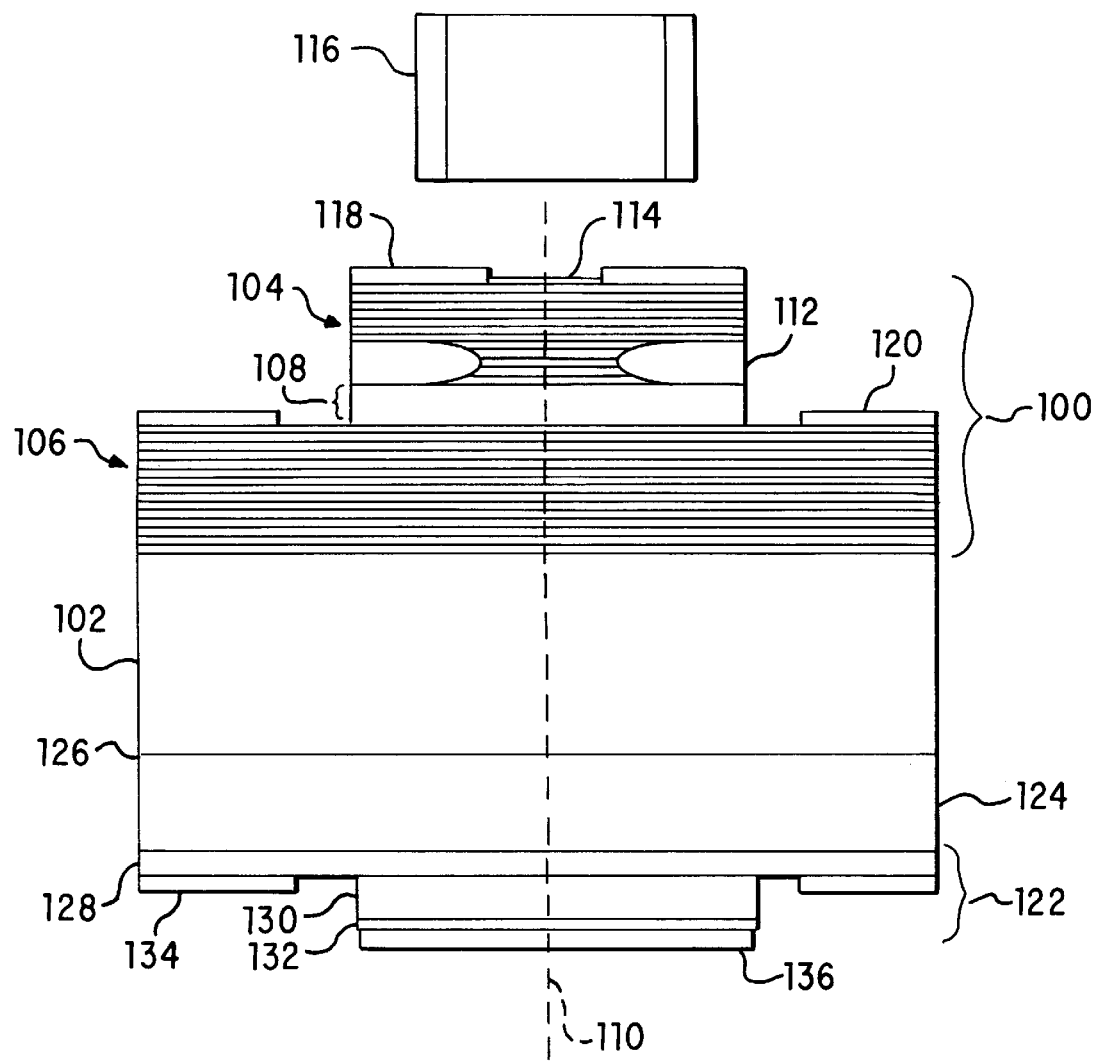
FIG. 7 is a side elevational view of an optoelectronic module at the first end of the parallel optical link shown in FIG. 6.

Referring to FIG. 7, the optoelectronic transceiver module at the first end of the parallel optical link for the 980 nm receive/780 nm transmit case is illustrated. An array of optoelectronic modules is coupled to an array of optical fibers. Each optoelectronic module coupled to each optical fiber includes a 780 nm VCSEL transmitter and a 980 nm photodetector monolithically integrated with the 780 nm VCSEL transmitter. The path of light propagation in each device is along its respective optical axis. The respective optical axes of the 780 nm VCSEL transmitter and the 980 nm photodetector are collinearly positioned longitudinally in-line with respect to the longitudinal direction of travel of the laser radiation so that they are coincidentally aligned along a common central longitudinal axis. Incoming 980 nm radiation passes through the transmitting 780 nm VCSEL of an optoelectronic module for receipt by the photodetector in that optoelectronic module.

Each 780 nm VCSEL transmitter is a top-emission VCSEL 100. The top-emission VCSEL 100 includes a plurality of layers of semiconductor formed on a compound semiconductor substrate, such as a semi-insulating GaAs substrate 102. The plurality of layers includes a top mirror stack 104, a bottom mirror stack 106, and an active region 108 interposed between the top mirror stack 104 and the bottom mirror stack 106. The top mirror stack 104 and the active region 108 are vertically etched down to the bottom mirror stack 106 forming a mesa structure on the bottom mirror stack 106 centered about the common central longitudinal axis 110 of the VCSEL transmitter and the photodetector.

The top mirror stack 104 is p-doped. The bottom mirror stack 106 is n-doped. Each of the top and bottom mirror stacks is a system of alternating layers of high refractive index material and low refractive index material which forms a distributed Bragg reflector. The number of pairs of alternating layers in each mirror stack determines, at least in part, the reflectivity of the mirror stack. In the 780 nm VCSEL 100 shown in FIG. 7, the number of pairs of alternating layers in the top mirror stack 104 is less than the number of pairs of alternating layers in the bottom mirror stack 106. In such a top-emission VCSEL, laser radiation is emitted vertically in a direction parallel to the common central longitudinal axis 110 from the top emitting surface of the top mirror stack 104.

A current confinement layer 112 is disposed in the top mirror stack 104 in a plane substantially transverse to the common central longitudinal axis 110 of the VCSEL transmitter and the photodetector. The current confinement layer 112 has an annular shape and is centered about the central longitudinal axis 110. The annular current confinement layer 112 operates as an aperture to confine current into a section of the active region 108.

An anti-reflection coating 114 is applied to the top-emitting surface of the top mirror stack 104. As a result, laser radiation can pass from the optical fiber 116 into the VCSEL 100 without excessive reflections.

The 780 nm VCSEL 100 is electrically powered using two metallized contacts. A first metallized p-type contact 118 is applied to the top emitting surface, which has the anti-reflective coating 114 applied thereto, of the top mirror stack 104. The first metallized p-type contact 118 has an annular shape defining an opening through which laser radiation can pass and is centered about the central longitudinal axis 110. Laser radiation emitted from the VCSEL 100 passes through the opening defined by the annular metallized p-type contact 118. A second metallized n-type contact 120 is applied to the bottom mirror stack 106. The second metallized n-type contact 120 has an annular shape and is centered about the central longitudinal axis 110. The metallized n-type contact 120 circumscribes the mesa structure formed by the top mirror stack 104 and the active region 108 together on the bottom mirror stack 106.

There is some leakage of 780 nm laser radiation from the top-emission VCSEL 100 into the semi-insulating GaAs substrate 102 beneath the bottom mirror stack 106. However, this 780 nm back-leakage is absorbed by the semi-insulating GaAs substrate 102.

At the first end of the parallel optical link, one of the array of 980 nm photodetectors is associated with each of the array of 780 nm VCSELs. Each of the array of photodetectors is longitudinally in-line with one of the array of VCSELs so that the central longitudinal axes of each of the integral photodetectors and VCSELs are collinear and parallel to the direction of travel of laser radiation in the optical link.

Each photodetector is a p-i-n photodetector 122. The photodetector 122 is formed beneath a semi-insulating compound semiconductor substrate, such as an indium phosphide (InP) substrate 124. The semi-insulating InP substrate 124 is wafer-fused to the semi-insulating GaAs substrate 102. This creates a wafer-fused interface 126 between the GaAs substrate 102 and the InP substrate 124. Alternatively, the GaAs substrate 102 and the InP substrate 124 can be metal-bonded together.

The p-i-n photodetector 122 includes a plurality of layers of semiconductor, which includes an n-doped layer of InP 128 beneath the semi-insulating InP substrate 124, an i-doped InGaAs absorber layer 130 beneath the n-doped layer of InP 128, and a p+-doped layer of InGaAs 132 beneath the absorber layer of InGaAs 130. The i-doped InGaAs absorber layer 130 and the p+-doped layer of InGaAs 132 form a mesa structure disposed beneath the n-doped layer of InP 128. The lateral dimension of the mesa structure portion of the p-i-n photodetector as measured transverse to the central longitudinal axis 110 is approximately 80 microns.

The 980 nm photodetector is electrically powered using a pair of metallized contacts. A third metallized n-type contact 134 is applied to the n-doped layer of InP 128. The third metallized n-type contact 134 has an annular shape and is centered about the central longitudinal axis 110. The metallized n-type contact 134 circumscribes the mesa structure formed by the i-doped layer of InGaAs absorber 130 and the p+-doped layer of InGaAs 132 disposed together on the n-doped layer of InP 128. A fourth metallized p-type contact 136 is applied beneath the p+-doped layer of InGaAs 132.

An optical fiber 116 is joined to the top mirror stack 104. The optical fiber 116 is a multi-mode fiber. The lateral linear dimension of the optical fiber 116 as measured transverse to the central longitudinal axis 110 is typically 50 microns or 62.5 microns. Incoming laser radiation at 980 nm passes from the optical fiber 116 into and through the VCSEL transmitter 100 to be received by the photodetector 122. Outgoing laser radiation at 780 nm is emitted from the VCSEL transmitter 100 into the optical fiber 116.

Figure 8:
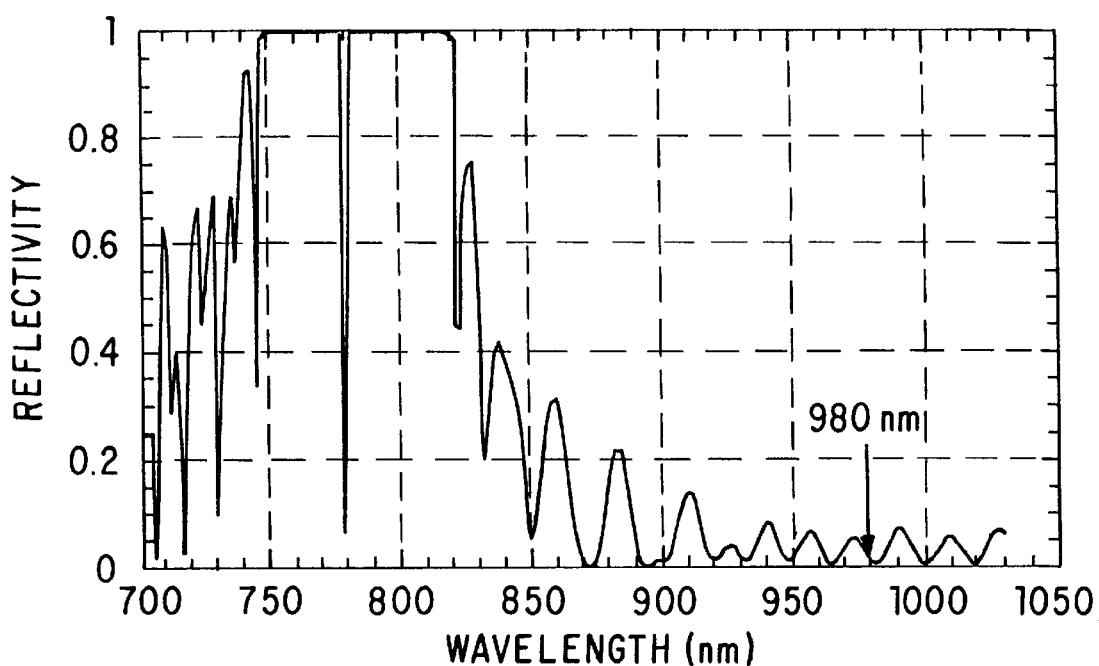
FIGS. 8 and 9 are graphs showing the reflection spectrum of the VCSEL transmitter in the optoelectronic module depicted in FIG. 7.
Figure 9:
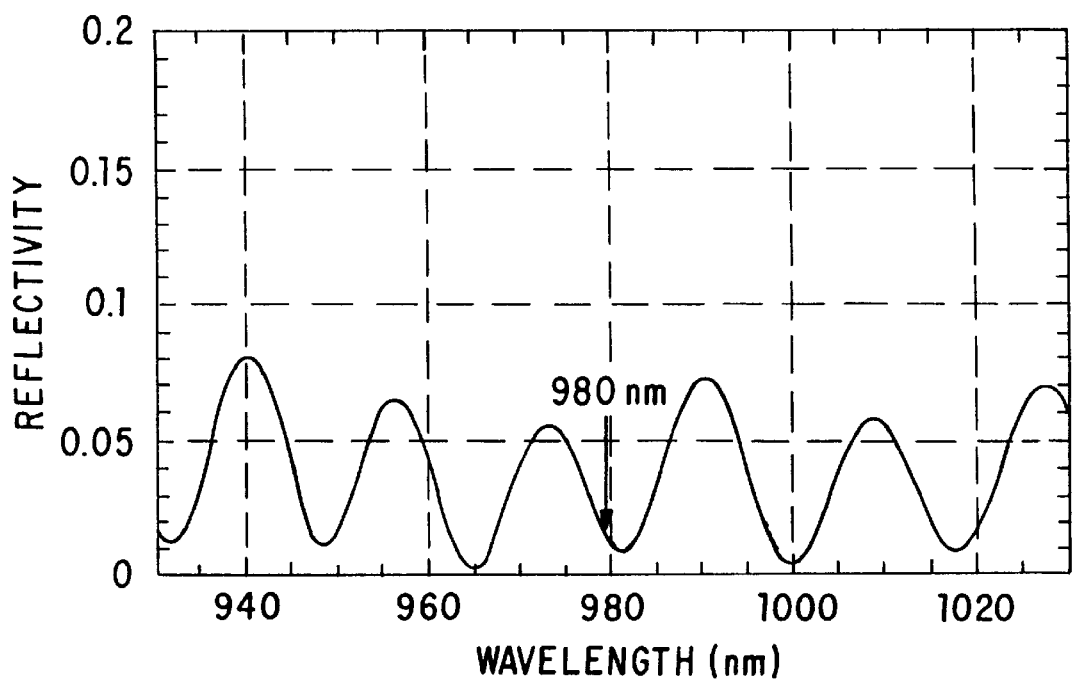

FIGS. 8 and 9 are graphs that illustrate the reflection spectrum of the 780 nm VCSEL transmitter. The reflection spectrum of the 780 nm VCSEL transmitter indicates that minimal reflection occurs at 980 nm. Essentially, the 780 nm VCSEL 100 neither absorbs nor reflects the 980 nm incoming laser radiation meant for the InP/InGaAsP photodetector 122. Thus, the 980 nm light can pass through the VCSEL transmitter destined for the photodetector. Any 780 nm laser radiation leaking out the backside of the top-emission VCSEL 100 will be absorbed in the semi-insulating GaAs substrate 102 so that it will not reach the photodetector 122. Therefore, optical crosstalk between the VCSEL and the photodetector is substantially eliminated.

Figure 10:
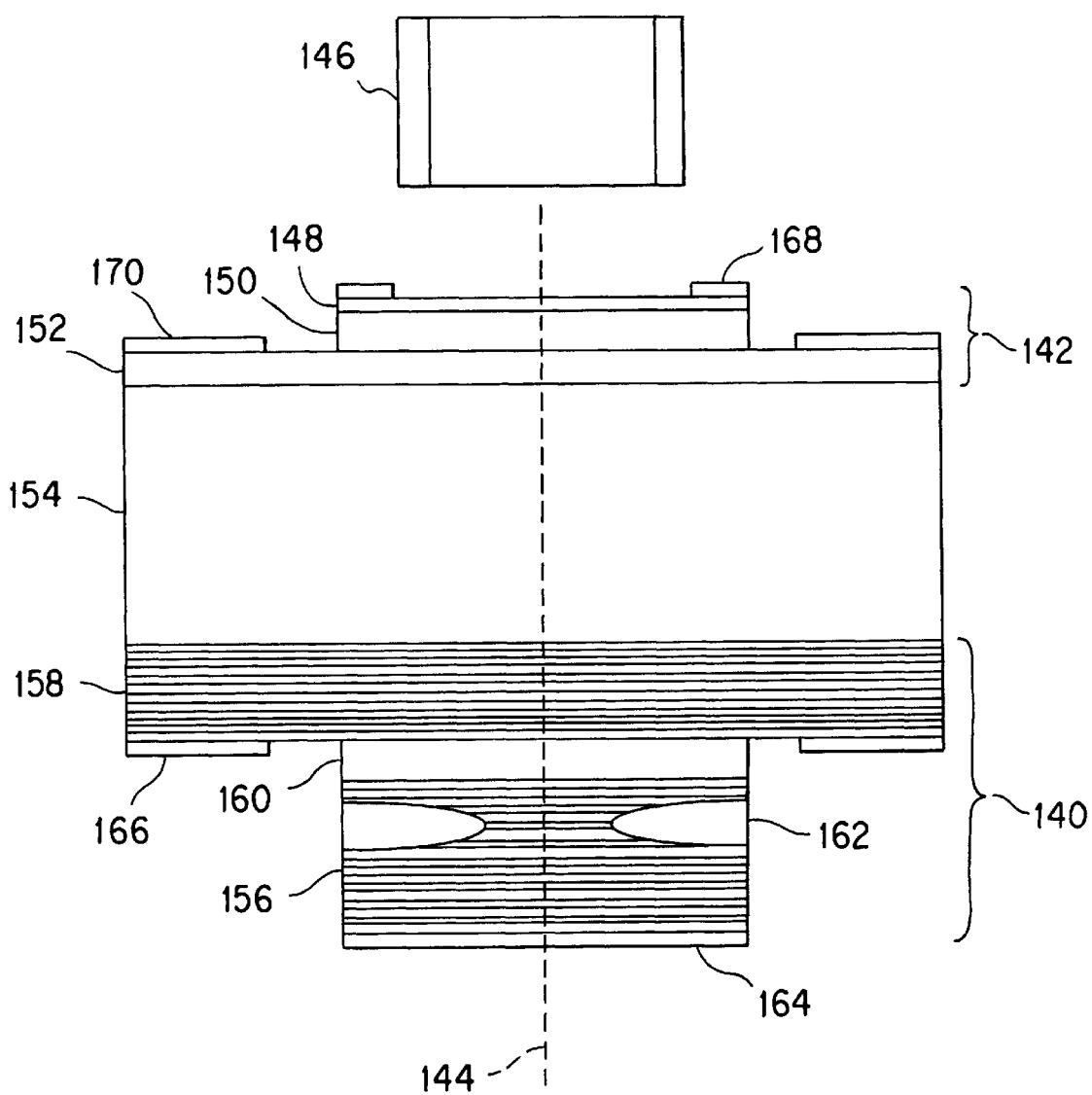
FIG. 10 is a side elevational view of an optoelectronic module at the second end of the parallel optical link shown in FIG. 6.

Referring to FIG. 10, the second end of the parallel optical link for one of the channels is illustrated. An optoelectronic transceiver module for each channel is coupled to one of the array of optical fibers. Each optoelectronic module includes a second 980 nm bottom-emission VCSEL 140 and a second 780 nm GaAs p-i-n photodetector 142 monolithically integrated with the second bottom-emission VCSEL 140. The second bottom-emission VCSEL 140 and the second p-i-n photodetector 142 have optical axes which are collinear so as to be coincidentally aligned along a common central longitudinal axis 144. The p-i-n photodetector 142 abuts the multi-mode optical fiber 146 associated with the transceiver module in the parallel optical link. The optical fiber 146 has a lateral linear dimension, as measured transverse to the common central longitudinal axis 144, which is typically 50 microns or 62.5 microns. Incoming laser radiation at 780 nm from the optical fiber 146 passes into the p-i-n photodetector 142. Outgoing 980 nm laser radiation transmitted by the VCSEL transmitter 140 passes through the p-i-n photodetector 142 into the optical fiber 146.

The 780 nm p-i-n photodetector 142 includes a plurality of layers of semiconductor, which includes a layer of p+-doped GaAs 148, an i-doped GaAs absorber region 150 beneath the layer of p+-doped GaAs 148, and a layer of n-doped GaAs 152 beneath the absorber region 150. The plurality of layers of which the p-i-n photodetector 142 is comprised is formed above a semi-insulating GaAs substrate 154.

The VCSEL transmitter 140 is disposed beneath the semi-insulating GaAs substrate 154. The bottom-emission VCSEL 140 includes a top mirror stack 156, a bottom mirror stack 158, and an active region 160 interposed between the top and bottom mirror stacks. The bottom mirror stack 158 of the VCSEL 140 is adjacent the semi-insulating GaAs substrate 154. The top mirror stack 156 is p-doped and the bottom mirror stack 158 is n-doped. The top mirror stack 156 has a greater number of pairs of alternating layers of high refractive index material and low refractive index material than that of the bottom mirror stack 158. The top mirror stack 156 and the active region 160 are vertically etched to form a mesa structure disposed beneath the bottom mirror stack 158.

A current confinement region 162 forming a current aperture is disposed in the top mirror stack 156. The current confinement region 162 presents an annular configuration centered about the central longitudinal axis 144 which constricts current flow to a portion of the active region 160. The lateral linear dimension of the current aperture defined by the annular current confinement 30 region 162, as measured transverse to the central longitudinal axis 144, is in a range from 10 to 40 microns.

The VCSEL transmitter 140 is electrically powered using two metallized contacts. A first metallized p-type contact 164 is disposed beneath the p-doped top mirror stack 156. A second metallized n-type contact 166 is disposed beneath the n-doped bottom mirror stack 158. The second metallized n-type contact 166 has an annular configuration centered about the central longitudinal axis 144 and circumscribes the mesa structure formed by the top mirror stack 156 and the active region 160 together beneath the bottom mirror stack 158.

Laser radiation is emitted from the bottom mirror stack 158 in a direction parallel to the central longitudinal axis 144 into the semi-insulating GaAs substrate 154.

The photodetector 142 is electrically powered using two metallized contacts. A third metallized p-type contact 168 is disposed above the layer of p+-doped GaAs 148. The third metallized p-type contact 168 presents an annular configuration centered about the common central longitudinal axis 144. A fourth metallized n-type contact 170 is disposed above the layer of n-doped GaAs 152.

The fourth metallized n-type contact 170 has an annular configuration centered about the central longitudinal axis 144 and circumscribes the mesa structure formed by the layer of p+-doped GaAs 148 and the i-doped GaAs absorber region 150 together above the layer of n-doped GaAs 152.

The array of top-illuminated photodetectors can be wafer-fused or epitaxially grown on the back side of the substrate shared with the array of bottom-emitting VCSELs. In the optoelectronic module shown in FIG. 10, the bottom-emission 980 nm VCSEL 140 emits through the GaAs p-i-n photodetector 142 grown on the bottom side emitting surface of the VCSEL wafer. The photodetector 142 absorbs the incoming 780 nm laser radiation, but allows the 980 nm laser radiation to pass through the 780 nm photodetector 142 without being reflected so feedback of 980 nm laser radiation is reduced. Any 780 nm leakage through the photodetector 142 is absorbed by the semi-insulating GaAs substrate 154 and will not reach the 980 nm VCSEL 140 so that operation of the 980 nm VCSEL 140 is not perturbed. The second end of the parallel optical link is therefore also free of optical crosstalk between the VCSELs and the photodetectors.

At both ends of the parallel optical link illustrated by FIGS. 7 and 10, the n-type contact of each of the array of VCSELs is isolated from the n-type contact of each of the array of photodetectors by one or more layers of semi-insulating substrate. This prevents electrical crosstalk between the VCSELs and the photodetectors.

Figure 11:
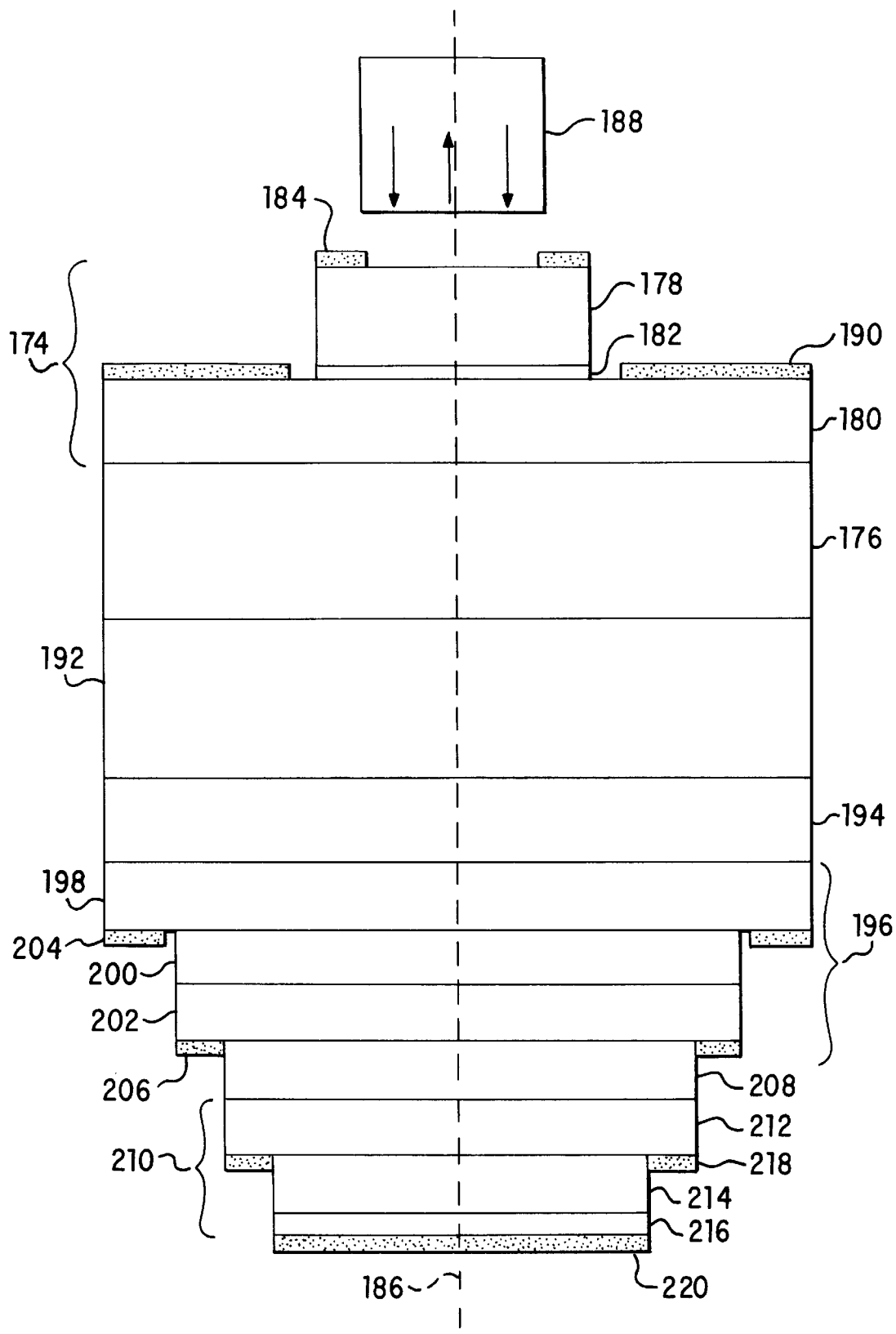
FIG. 11 is a side elevational view of an optoelectronic module according to the principles of the invention.

Referring to FIG. 11, an optoelectronic module for use in a free-space link or connectable to an optical fiber includes a top-emission 1.26 μm VCSEL 174 which can be optically or electrically pumped. The VCSEL 174 is fabricated on a layer of semi-insulating GaAs 176. The VCSEL 174 includes a top mirror stack 178, a bottom mirror stack 180, and an active region 182 interposed between the top and bottom mirror stacks. The top mirror stack 178 and the bottom mirror stack 180 are each distributed Bragg reflectors made from the GaAs/AlGaAs system. Both of the top and bottom mirror stacks are wafer-fused to the active region 182.

The top mirror stack 178 and the active region 182 are vertically etched down to the bottom mirror stack 180 to form a mesa structure disposed above the bottom mirror stack 180. If the VCSEL 174 is electrically pumped, two metallized contacts can be used. A first metallized p-type contact 184 is applied to the top mirror stack 178. The first metallized p-type contact 184 has an annular configuration. The first metallized p-type contact 184 is centered about the central longitudinal axis 186. The annular shape of the first p-type metallized contact 184 defines an opening through which laser radiation can pass into and from the optical fiber 188 or free-space link. A second metallized n-type contact 190 is applied to the bottom mirror stack 180. The second metallized n-type contact 190 has an annular configuration and is centered about the central longitudinal axis 186. The second metallized n-type contact 190 circumscribes the mesa structure formed by the top mirror stack 178 and the active region 182 disposed above the bottom mirror stack 180.

A layer of semi-insulating InP 192 is disposed beneath the layer of semi-insulating GaAs 176. An absorber layer 194 of InGaAsP designed to absorb backleaking 1.26 micron wavelength light from the bottom mirror stack 180 of the VCSEL 174 is disposed beneath the layer of semi-insulating InP 192.

A front photodetector 196 is disposed beneath the absorber layer of InGaAsP 194. The front photodetector 196 includes an n-doped InP contact layer 198, a layer of undoped InGaAsP 200 designed to detect incoming 1.36 μm light, and a p-doped InGaAsP contact layer 202. The front photodetector 196 is electrically powered using a pair of metallized contacts. A third metallized n-type contact 204 is applied to the n-doped InP contact layer 198. The third metallized n-type contact 204 presents an annular configuration centered about the central longitudinal axis 186 and circumscribing the layer of undoped InGaAsP 200. A fourth metallized p-type contact 206 is applied to the p-doped InGaAsP contact layer 202. The fourth metallized p-type contact 206 has an annular configuration and is centered about the central longitudinal axis 186. An undoped InP isolation layer 208 is disposed beneath the p-doped InGaAsP contact layer 202.

A back photodetector 210 is disposed beneath the front photodetector 196. The back photodetector 210 is monolithically integrated with the front photodetector 196 beneath the undoped InP isolation layer 208. The back photodetector 210 includes an n-doped InP contact layer 212 beneath the undoped InP isolation layer 208, an undoped InGaAs layer 214 designed to detect incoming 1.55 μm light beneath the n-doped InP contact layer 212, and a p-doped InGaAs contact layer 216 beneath the layer of undoped InGaAs 214.

The back photodetector 210 is electrically powered using a pair of metallized contacts. A fifth metallized n-type contact 218 is applied to the n-doped InP contact layer 212. The fifth metallized n-type contact 218 has an annular configuration centered about the central longitudinal axis 186 and circumscribing the layer of undoped InGaAs 214. A sixth metallized p-type contact 220 is applied to the p-doped InGaAs contact layer 216.

The optoelectronic module shown in FIG. 11 can be operated to transmit and receive on a single optical fiber or over a free-space optical link. The optoelectronic module can detect incoming light at 1.55 microns and at a wavelength just over 1.3 microns, which is referred to as $1.3^+$ microns. An example wavelength for $1.3^+$ microns is 1.36 microns. The optoelectronic module also transmits at just under 1.3 microns, which is referred to as $1.3^-$ microns. An exemplary wavelength for $1.3^-$ microns is 1.26 microns. All three wavelengths travel in the same optical fiber. The two incoming wavelengths pass through the VCSEL before transversely illuminating the photodetectors.

Figure 12:
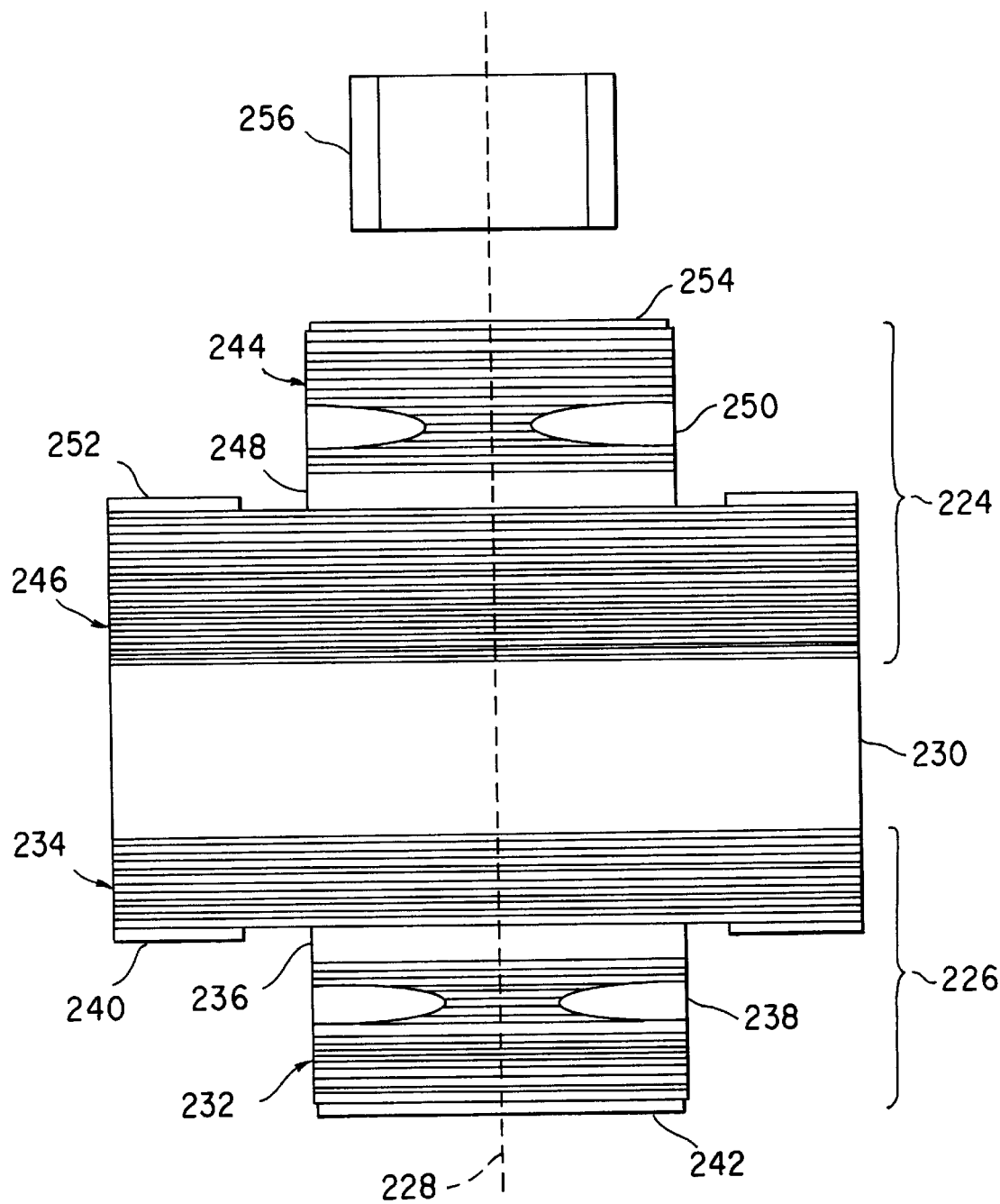
FIG. 12 is a side elevational view of an optoelectronic module according to the principles of the invention.

Referring to FIG. 12, a double-source optoelectronic module can be used in a free-space optical link or connected to a single optical fiber. The optoelectronic module can emit two laser signals having two differing wavelengths into the same single optical fiber or free-space link.

The optoelectronic module shown in FIG. 12 includes a front VCSEL transmitter 224 and a back VCSEL transmitter 226. The front VCSEL transmitter 224 is a top-emission VCSEL. The back VCSEL transmitter 226 is a bottom-emission VCSEL. The top-emission VCSEL 224 and the bottom-emission VCSEL 226 have optical axes which are collinearly aligned along a central longitudinal axis 228. The path of light propagation in each device is along its respective optical axis.

The bottom-emission VCSEL 226 is epitaxially grown in a wafer-scale fabrication process, which facilitates creation of one and two-dimensional arrays of such devices, on a semi-insulating compound semiconductor substrate 230, such as a GaAs substrate. The bottom-emission VCSEL 226 includes a top mirror stack 232, a bottom mirror stack 234, and an active region 236 interposed between the top mirror stack 232 and the bottom mirror stack 234. The bottom mirror stack 234 is n-doped and the top mirror stack 232 is p-doped. Each of the top and bottom mirror stacks is made from the GaAs/AlGaAs system.

An annular current confinement region 238 is disposed in the top mirror stack 232 in a plane substantially transverse to the common central longitudinal axis 228. The top mirror stack 232 and the active region 236 are vertically etched down to the bottom mirror stack 234 and together form a mesa structure.

The bottom-emission VCSEL 226 is electrically pumped to emit coherent electromagnetic radiation having a wavelength substantially equal to 980 nm into the semi-insulating compound semiconductor substrate 230 using a pair of metallized contacts. A first n-type metallized contact 240 is applied to the bottom mirror stack 234. The first n-type metallized contact 240 has an annular configuration, circumscribes the active region 236, and is centered about the central longitudinal axis 228. A second p-type metallized contact 242 is applied to the top mirror stack 232.

After the bottom-emission VCSEL 226 is epitaxially grown on the compound semiconductor substrate 230 in the wafer-scale process, the substrate 230 and bottom-emission VCSEL 226 thereon are flipped so that the top-emission VCSEL 224 can be epitaxially grown in a wafer-scale process on the backside of the substrate 230 shared with the bottom-emission VCSEL 226.

The top-emission VCSEL 224 includes a top mirror stack 244, a bottom mirror stack 246, and an active region 248 interposed between the top mirror stack 244 and the bottom mirror stack 246. The bottom mirror stack 246 is n-doped and the top mirror stack 244 is p-doped. Each of the top and bottom mirror stacks is made from the GaAs/AlGaAs system.

An annular current confinement region 250 is disposed in the top mirror stack 244 in a plane substantially transverse to the common central longitudinal axis 228. The top mirror stack 244 and the active region 248 are vertically etched down to the bottom mirror stack 246 and together form a mesa structure.

The top-emission VCSEL 224 is electrically pumped to emit coherent electromagnetic radiation having a wavelength in a range from 700 nm to 870 nm, for example 780 nm, from the top mirror stack 244 in a direction parallel to the central longitudinal axis 228 using a pair of metallized contacts. A third n-type metallized contact 252 is applied to the bottom mirror stack 246. The third n-type metallized contact 252 has an annular configuration circumscribing the active region 248 so as to be centered about the central longitudinal axis 228. A fourth p-type metallized contact 254 is applied to the top mirror stack 244.

The optoelectronic module shown in FIG. 12 can be used in a free-space link or can be connected to an optical fiber 256, which can be a single-mode or multi-mode fiber. The optical fiber 256 includes a core and a cladding surrounding the core. When connected, the optical fiber 256 abuts the fourth p-type metallized contact 254 in confronting relationship. The optical fiber 256 is optically coupled to receive laser signals from the optoelectronic module. For example, the top-emission VCSEL 224 and the bottom-emission VCSEL 226 in the optoelectronic module transmit 780 nm laser radiation and 980 nm laser radiation, respectively, into the single optical fiber 256.

Laser radiation having a wavelength in a range from 870 nm to 1050 nm (e.g., 980 nm) emitted by the bottom-emission VCSEL 226 passes through the top-emission VCSEL 224 into the optical fiber 256. The top-emission VCSEL 224 does not absorb the 980 nm laser radiation passing therethrough emitted by the bottom-emission VCSEL 226. The top-emission VCSEL 224 is designed to have minimal reflectance to 980 nm laser radiation.

Any back-leaking 780 nm laser radiation leaking from the bottom mirror stack 246 of the top-emission VCSEL 224 will be absorbed by the semi-insulating compound semiconductor substrate 230, and will not reach the bottom-emission VCSEL 226.

The principles of the invention can be practiced in a multi-channel data distribution system, which can convey a variety of data between one or more central distribution points and one or more nodes linked to each central distribution point. Example data distribution systems are fiber-to-the-home (FTTH) and fiber-to-the-desk (FTTD) systems. In a fiber-to-the-home (FTTH) system or a fiber-to-the-desk (FTTD) system, the central distribution point distributes information to the nodes over optical fiber.

Figure 13:
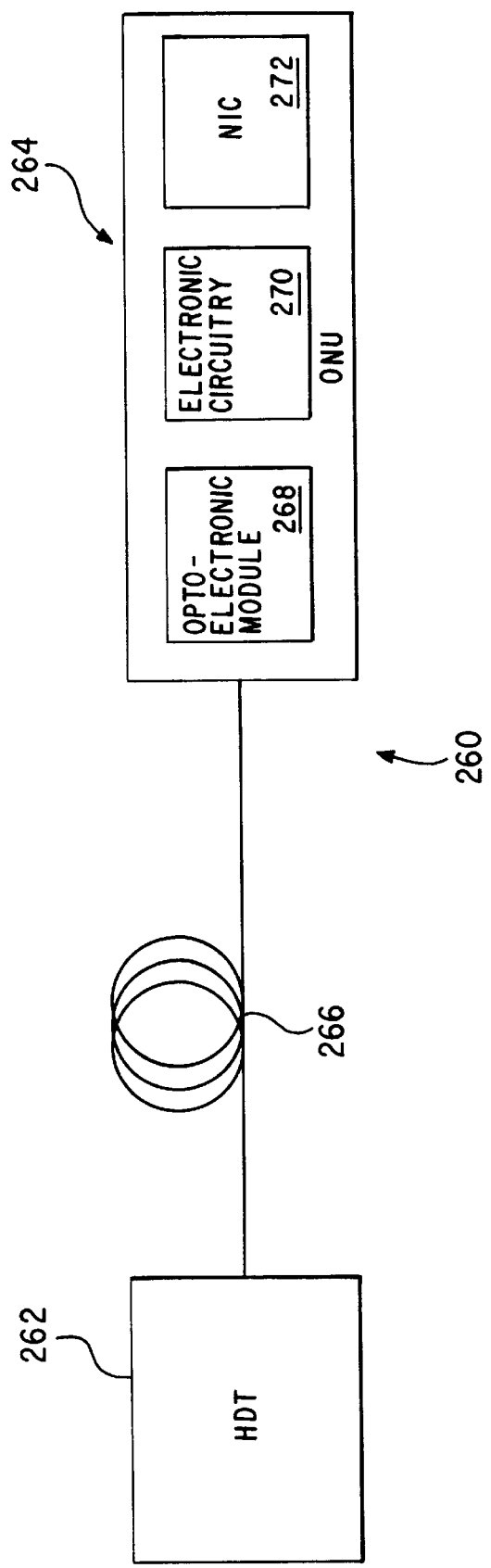
FIGS. 13 and 14 are each schematic views of a data distribution system according to the principles of the invention.

Referring to FIG. 13, an exemplary FTTH system 260 includes a host digital terminal (HDT) 262 and a group of optical network units (ONUs), such as ONU 264, linked to the host digital terminal (HDT) so that wavelength-division multiplexed optical signals can be transmitted and received between each optical network unit (ONU) 264 and the host digital terminal (HDT) 262. Each node in the FTTH system includes an ONU located at an individual home and the central distribution point includes an HDT serving a number of homes within a geographic area. The medium of transmission through which each of the group of ONUs are optically coupled to the HDT for bidirectional transmission and reception can be a single optical fiber 266, which can be single-mode or multimode fiber. Bidirectional transmission occurs over each of the single optical fibers.

Each of the network of optical network units (ONUs) includes an optoelectronic module 268 for transmitting and/or receiving optical laser signals having differing wavelength signals in the optical link. The optoelectronic module 268 can be implemented as illustrated by FIG. 2 or FIG. 11, for example. Optical linking is accomplished through optical fiber. In the example shown in FIG. 13, the optoelectronic module 268 of the ONU is operative to transmit and/or receive wavelength-division multiplexed (WDM) optical laser signals having differing wavelengths into and from the single optical fiber 266. The ONU 264 shown in FIG. 13 includes logic and electronic circuitry 270 which can generate and process signals to control the bidirectional WDM optoelectronic module 268. A programmable network interface card (NIC) 272 in each ONU 264 allows the ONU to be configured and modified for system operating requirements.

In a first illustrative embodiment, the optical network unit (ONU) 264 at each home transmits information to the HDT 262 on a laser signal having a first wavelength, and receives information from the HDT 262 on a laser signal having a second wavelength. The HDT 262 is operative to transmit data to the ONU 264 on a laser signal having the second wavelength, and is operative to receive data from the ONU 264 on a laser signal having the first wavelength. The first wavelength is 1.3 μm and the second wavelength is 1.55 μm.

In a second illustrative embodiment, the optical network unit (ONU) 264 at each home transmits information to the HDT 262 on a transmitted laser signal having a first wavelength, and receives information from the HDT 262 on two received laser signals having a second and a third wavelength, respectively. The HDT 262 transmits information to the ONU 264 on the two laser signals having the second and third wavelengths, respectively, and receives information from the ONU 264 on a laser signal having the first wavelength. The first wavelength transmitted from the ONU 264 at the home into the optical link is 1.3⁻ μm, the second wavelength transmitted from the HDT 262 to the ONU 264 at the home is 1.55 μm, and the third wavelength transmitted from the HDT 262 to the ONU 264 at the home is 1.3+ μm.

Figure 14:
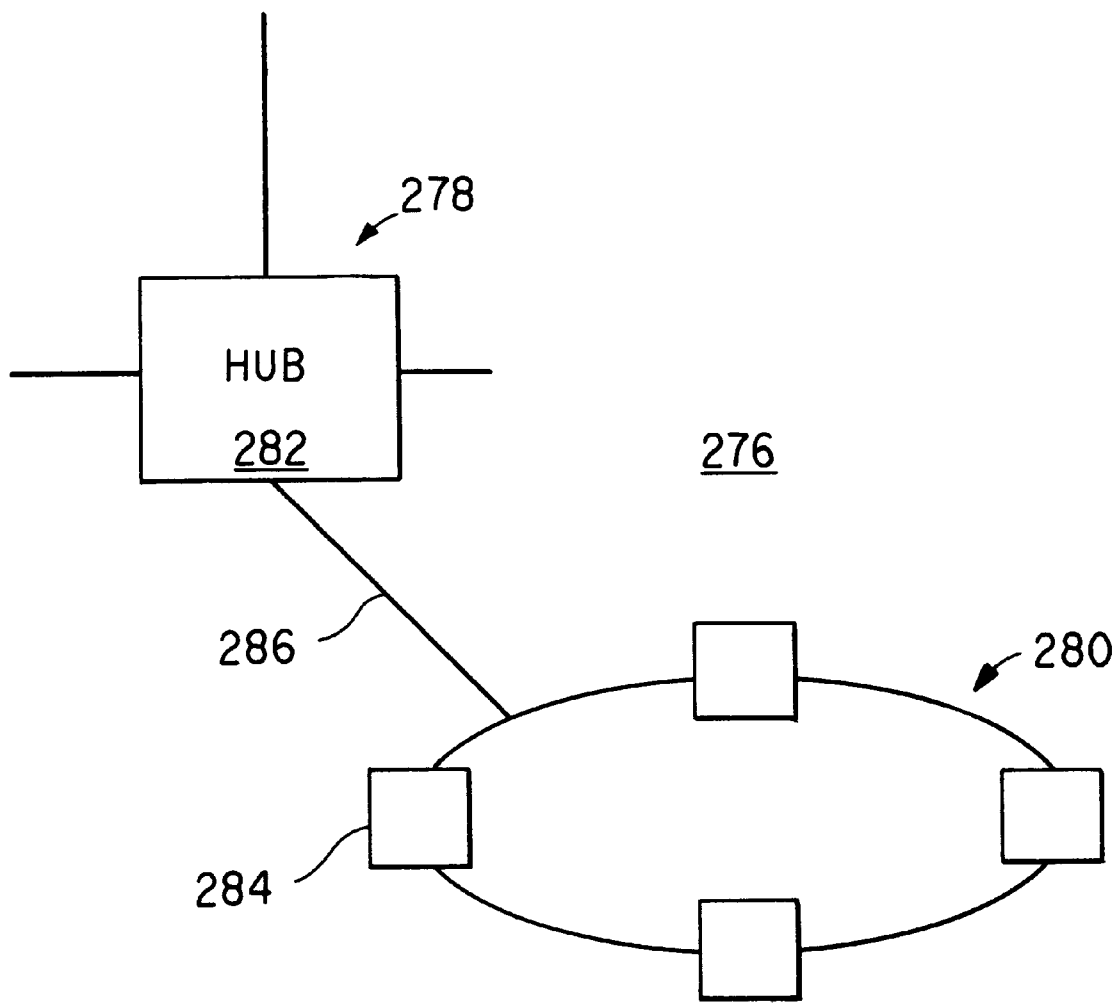

Referring to FIG. 14, an exemplary FTTD system 276 includes a central distribution point 278 linked to one or more networks 280 of office nodes throughout a building (or group of buildings) so that data can be bidirectionally distributed between the central distribution point 278 and the network 280 of office nodes. The central distribution point 278 in the building includes a hub 282 with switching facilities. One or more networks of individual office nodes are linked to the hub in the building. Each individual office node in a network includes a desk-top box 284 located at a desk. The medium 286 linking the nodes in each network 280, and the networks to the hub 282 is optical fiber. The hub 282 operates to switch communications to and from the linked network of nodes. A network interface card is used at the hub and at each desk-top box in the network to establish protocols for such communications and to route signals among the linked networks.

Each of the network 280 of desk-top boxes 284 located at desks is able to transmit a laser signal having a first wavelength to the centrally located hub 282, and is able to receive a laser signal having a second wavelength from the hub 282. The hub 282 is able to transmit a laser signal having the second wavelength to each of the desk-top boxes 284, and can receive a laser signal having the first wavelength from each of the desk-top boxes 284.

In an illustrative embodiment, the first wavelength is in a range from 870 nm to 1050 nm, such as, for example, 980 nm. The second wavelength is in a range from 700 nm to 870 nm, such as, for example, 780 nm.

While several particular forms of the invention have been illustrated and described, it will also be apparent that various modifications can be made without departing from the spirit and scope of the invention.

What is claimed is:

1. An optoelectronic module comprising:

a first vertical cavity surface emitting laser (VCSEL) having top and bottom mirror stacks and an active region interposed therebetween, said first VCSEL being operable to transmit a signal having a first wavelength in a range from about 770 to about 870 nm;

wherein a second signal having a second wavelength in a range from about 900 nm to about 1000 nm is routed through at least said top and bottom mirror stacks and said active region while said first VCSEL is transmitting said signal having said first wavelength; and wherein said second signal having said second wavelength is not substantially absorbed by said first VCSEL.

2. An optoelectronic module as defined in claim 1, wherein the optoelectronic module further comprises:

a second laser which is operative to transmit the second signal.

3. An optoelectronic module as defined in claim 2, wherein:

the second laser is a VCSEL.

4. An optoelectronic module as defined in claim 1, wherein the opoelectronic module further comprises:

a photodetector which is operative to receive the second signal.

5. An optoelectronic module as defined in claim 3, wherein:

the second laser is monolithically integrated with the first VCSEL.

6. An optoelectronic module as defined in claim 4, wherein:

the photodetector is monolithically integrated with the first VCSEL.

7. An optoelectronic module as defined in claim 3, wherein:

the optical axes of the first VCSEL and the second laser are substantially collinear.

8. An optoelectronic module as defined in claim 4, wherein:

the optical axes of the first VCSEL and the photodetector are substantially collinear.

9. A process for routing optical signals in an optical link, comprising the following steps:

(A) transmitting a laser signal from an optoelectronic module, which includes a composite-layer first vertical cavity surface emitting laser (VCSEL), into an optical link, the transmitted laser signal having a first wavelength in a range from about 770 nm to about 870 nm; and (B) passing a second laser signal through one or more layers of the composite-layer first VCSEL, the second laser signal having a second wavelength in a range from about 900 nm to about 1000 nm; wherein the second laser signal is not substantially absorbed by said first VCSEL.

10. A process as defined in claim 9, further comprising the step of:

transmitting the second laser signal into the optical link.

11. A process as defined in claim 9, further comprising the step of:

receiving the second laser signal from the optical link.

12. A process as defined in claim 9, wherein the optoelectronic module further comprises:

a second laser which is operative to transmit the second laser signal.

13. A process as defined in claim 12, wherein:

the second laser is a VCSEL.

14. A process as defined in claim 9, wherein the optoelectronic module further comprises:

a photodetector which is operative to receive the second laser signal.

15. An optoelectronic module for use in an optical link, coprising:

a vertical cavity surface emitting laser (VCSEL) which is operative to trasmit a signal having a first wavelength in a range from about 770 nm to about 870 nm into an optical link; and a photodetector which is operative to receive a signal having a second wavelength in a range from about 900 nm to about 1000 nm from the optical link; wherein the optical axes of the VCSEL transmitter and the photodetector are substantially collinear; and wherein said first signal is transmitted by said VCSEL and said second signal is received by said photodetector.

16. An optoelectronic module as defined in claim 15, wherein the VCSEL includes:

a pair of mirror stacks;

an active region interposed between the pair of mirror stacks; and a wafer-fused interface between one of the pair of mirror stacks and the active region.

17. An optoelectronic module as defined in claim 16, wherein:

each of the pair of mirror stacks is a system of alternating layers of GaAs and AlGaAs forming a distributed Bragg reflector.

18. An optoelectronic module as defined in claim 15, wherein the VCSEL includes:
a pair of mirror stacks, wherein
one of the pair of mirror stacks is less than 0.0001 percent transmissive to electromagnetic radiation having the first wavelength.

19. An optoelectronic module as defined in claim 15, wherein the VCSEL includes a pair of mirror stacks, and further comprising:
an absorber layer which is adapted to absorb electromagnetic radiation having the first wavelength.

20. An optoelectronic module as defined in claim 15, further comprising:
an optical fiber coupled to the VCSEL.

21. An optoelectronic module as defined in claim 20, wherein:
the optical fiber is a single-mode fiber.

22. An optoelectronic module as defined in claim 15, wherein:
the second wavelength is less than the first wavelength, and
the transmitted signal passes through the photodetector before ertering the optical link.

23. An optoelectronic module as defined in claim 19, further comprising:
an optical fiber coupled to the photodetector.

24. A parallel optical link for one or more duplex channels, comprising:
an array of optical fibers;
a first array of optoelectronic modules,
each of the first array of optoelectronic modules includes a vertical cavity surface emitting laser (VCSEL) and a photodetector having optical axes which are substantially collinear,
the first array of optoelectronic modules is optically coupled to the array of optical fibers to transmit a laser signal having a first wavelength in a range from about 770 to about 870 and receive a laser signal having a second wavelength in a range from about 900 nm to about 1000 nm; and
a second array of optoelectronic modules,
each of the second array of optoelectronic modules includes a VCSEL and a photodetector having optical axes which are substantially collinear,
the second array of optoelectronic modules is optically coupled to the array of optical fibers to transmit the laser signal having the second wavelength and receive the laser signal having the first wavelength.

25. A link as defined in claim 35, wherein the first array of optoelectronic modules comprises:
a first array of top-emission VCSELs to transmit the laser signal having the first wavelength into the array of optical fibers; and
a first array of bottom-illuminated photodetectors to receive the laser signal having the second wavelength from the array of optical fibers; wherein
each of the first array of top-emission VCSELs is coincidentally aligned along a common central longitudinal axis with one of the first array of bottom-illuminated photodetectors; and
the laser signal having the second wavelength passes through the first array of VCSELs before being received by the first array of photodetectors.

26. A link as defined in claim 25, wherein:
the first array of top-emission VCSELs and the first array of bottom-illuminated photodetectors are monolithically integrated.

27. A link as defined in claim 24, wherein the second array of optoelectronic modules comprises:
a second array of top-illuminated photodetectors to receive the laser signal having the first wavelength from the array of optical fibers; and
a second array of bottom-emission VCSELs to transmit the laser signal having the second wavelength into the array of optical fibers; wherein
each of the second array of top-illuminated photodetectors is coincidentally aligned along a common central longitudinal axis with one of second array of bottom-emission VCSELs; and
the laser signal having the second wavelength passes through the second array of photodetectors before entering the array of optical fibers.

28. A link as defined in claim 27, wherein:
the second array of top-illuminated photodetectors and the second array of bottom-emission VCSELs are monolithically integrated.

29. A link as defined in claim 25, wherein:
the first array of bottom-illuminated photodetectors is wafer-fused to the first array of top-emission VCSELs.

30. A link as defined in claim 25, wherein:
the first array of bottom-illuminated photodetectors is metal-bonded to the first array of top-emission VCSELs.

31. A link as defined in claim 27, wherein:
the second array of top-illuminated photodetectors is grown on a back side of a substrate shared with the second array of bottom-emission VCSELs.

32. A link as defined in claim 27, wherein:
the second array of top-illuminated photodetectors is wafer-fused to the second array of bottom-emission VCSELs.

33. A link as defined in claim 24, wherein:
each of the array of optical fibers is a multi-mode optical fiber.

34. A link as defined in claim 24, wherein:
each of the array of optical fibers is a single-mode optical fiber.

35. A link as defined in claim 25, further comprising:
a top n-type contact to electrically pump the first array of top-emission VCSELs;
a bottom n-type contact to electrically power the first array of bottom-illuminated photodetectors; and
one or more layers of semi-insulating substrate electrically isolating the bottom n-type contact from the top n-type contact.

36. A link as defined in claim 27, further comprising:
a top n-type contact to electrically power the second array of top-illuminated photodetectors;
a bottom n-type contact to electrically pump the second array of bottom-emitting VCSELs; and
one or more layers of semi-insulating substrate electrically isolating the top n-type contact from the bottom n-type contact.

37. An optoelectronic module for use in an optical link, comprising:
a vertical cavity surface emitting laser (VCSEL) transmitter, the VCSEL transmitter is operative to transmit a first laser signal into an optical fiber, the first laser signal having a first wavelength;

a front photodetector, the front photodetector is operative to receive a second laser signal from the optical fiber, the second laser signal having a second wavelength; and a back photodetector, the back photodetector is operative to receive a third laser signal from the optical fiber, the third laser signal having a third wavelength; wherein the VCSEL transmitter, the front photodetector, and the back photodetector have optical axes which are substantially collinear.

38. An optoelectronic module as defined in claim 37, wherein:

the first wavelength is in a range from 1.25 microns to 1.31 microns, the second wavelength is in a range from 1.31 microns to 1.36 microns, and the third wavelength is substantially equal to 1.55 microns.

39. An optoelectronic module as defined in claim 37, wherein:

the front photodetector and the back photodetector are monolithically integrated on an InP substrate.

40. An optoelectronic module as defined in claim 37, wherein the VCSEL transmitter includes:

a pair of mirror stacks, and an active region interposed between the pair of mirror stacks, wherein the pair of mirror stacks are wafer-fused to the active region.

41. An optoelectronic module as defined in claim 37, wherein:

the VCSEL transmitter is optically pumped to generate the first laser signal.

42. A fiber-to-the-home system, comprising:

a host digital terminal distributing data to a number of homes in a geographic area;

an optical network unit at one or more of the number of homes connected to the host digital terminal by optical fiber; wherein the optical network unit includes an optoelectronic module as defined in claims 1 or 19.

43. A fiber-to-the-home system, comprising:

a host digital terminal distributing data to a number of homes in a geographic area;

an optical network unit at one or more of the number of homes connected to the host digital terminal by optical fiber; wherein the optical network unit includes an optoelectronic module as defined in claim 37.

44. A fiber-to-the-home system, comprising:

a host digital terminal distributing data to a number of homes in a geographic area;

an optical network unit at one or more of the number of homes connected to the host digital terminal by optical fiber; wherein the optical network unit includes an optoelectronic module as defined in claim 15.

45. A fiber-to-the-home system, comprising:

a host digital terminal distributing data to a number of homes in a geographic area;

an optical network unit at one or more of the number of homes connected to the host digital terminal by optical fiber; wherein the host digital terminal includes an optoelectronic module as defined in claim 15.

46. A fiber-to-the-desk system, comprising:

a central distribution point distributing data to a number of offices; and an optoelectronic module as defined in claim 22 at one or more of the number of offices connected to the central distribution point by optical fiber.

47. A fiber-to-the-desk system, comprising:

a central distribution point distributing data to a number of offices; and a plurality of optoelectronic modules connected to the central distribution point by optical fiber; wherein the central distribution point includes an optoelectronic module as defined in claim 15.

48. A fiber-to-the-desk system, comprising:

a central distribution point distributing data to a number of offices; and an optoelectronic module as defined in claim 15 at one or more of the number of offices connected to the central distribution point by optical fiber.

49. A fiber-to-the-desk system, comprising:

a central distribution point distributing data to a number of offices; and a plurality of optoelectronic modules connected to the central distribution point by optical fiber; wherein the central distribution point includes an optoelectronic module as defined claim 15.

50. A fiber-to-the-desk system, comprising:

a central distribution point distributing data to a number of offices; and a plurality of optoelectronic modules connected to the central distribution point by optical fiber; wherein the central distribution point includes an optoelectronic module as defined in claim 15.

51. A fiber-to-the-desk system, comprising:

a central distribution point distributing data to a number of offices; and a plurality of optoelectronic modules connected to the central distribution point by optical fiber; wherein the central distribution point includes an optoelectronic module as defined as in claim 22.

52. A fiber-to-the-desk system, comprising:

a central distribution point distributing data to a number of offices; and an optoelectronic module as defined in claim 15 at one or more of the number of offices connected to the central distribution point by optical fiber.

53. A fiber-to-the-desk system, comprising:

a central distribution point distributing data to a number of offices; and an optoelectronic module as defined in claim 15 at one or more of the number of offices connected to the central distribution point by optical fiber.

* * * * *